United States Patent [19]
Vance

[11] Patent Number: 4,726,042
[45] Date of Patent: Feb. 16, 1988

[54] A/D CONVERTERS

[75] Inventor: Ian A. W. Vance, Newport, United Kingdom

[73] Assignee: STC, PLC, England

[21] Appl. No.: 829,068

[22] Filed: Feb. 13, 1986

[30] Foreign Application Priority Data

Mar. 7, 1985 [GB] United Kingdom ................ 8505922

[51] Int. Cl.$^4$ .............................................. H04B 1/10
[52] U.S. Cl. .................................... 375/102; 375/103; 333/172; 328/127
[58] Field of Search .................... 375/25, 30, 34, 75, 375/77, 102, 103; 455/23, 43, 324; 360/29, 32; 340/347 AD, 347 CC; 333/172; 328/127

[56] References Cited

U.S. PATENT DOCUMENTS

| | | | |
|---|---|---|---|
| 3,444,469 | 5/1969 | Miyagi | 333/172 |
| 3,588,531 | 6/1971 | Bjor | 333/172 |
| 3,649,922 | 3/1972 | Ralph et al. | 333/172 |
| 4,414,536 | 11/1983 | Sumi | 375/30 |
| 4,447,909 | 5/1984 | Hjorring | 375/103 |
| 4,470,147 | 9/1984 | Goatcher | 375/77 |
| 4,493,091 | 1/1985 | Gundry | 375/30 |

FOREIGN PATENT DOCUMENTS

| | | |
|---|---|---|
| 982204 | 7/1962 | United Kingdom . |
| 1506262 | 4/1978 | United Kingdom . |
| 2022947 | 12/1979 | United Kingdom . |

*Primary Examiner*—Robert L. Griffin
*Assistant Examiner*—Marianne Huseman
*Attorney, Agent, or Firm*—Kerkam, Stowell, Kondracki & Clarke

[57] ABSTRACT

An analogue-to-digital converter arrangement including a signal de-emphasis network $10_I$, $10_Q$ which attenuates higher frequency analogue signals relative to lower frequency analogue signals, an A/D converter $11_I$, $11_Q$ to which the de-emphasised signals are applied, and a pre-emphasis network $12_I$, $12_Q$ substantially complementary to the de-emphasis network to which the digitised signals are applied.

4 Claims, 4 Drawing Figures

A/D CONVERTERS

BACKGROUND OF THE INVENTION

This invention relates to analogue-to-digital converters used in a zero IF radio at the baseband in order to convert the analogue signals into digital signals for subsequent digital signal processing.

DESCRIPTION OF RELATED ART

This form of radio has been described in British patent application No. 8127797 now British Pat. No. 2,106,734, corresponding to Goatcher U.S. Pat. No. 4,470,147, and has been seen there to be a universal type of radio having many advantages. One of the critical problems is that the channel filters need to be made as digital filters if all the flexibility of this configuration is to be achieved. A consequence of the channel filters being made digital is that the analogue-to-digital converter which precedes them in each of the I and Q zero IF channels has to handle the full dynamic range of the incoming signals. In some specialised radio applications this dynamic range can be as much as 120 dB. This implies the need for some 20 bits equivalent in the analogue-to-digital converter which is a performance very difficult to achieve.

SUMMARY OF THE INVENTION

According to the present invention there is provided an analogue-to-digital converter arrangement including a signal de-emphasis network which attenuates higher frequency analogue signals relative to lower frequency analogue signals, an A/D converter to which the de-emphasised signals are applied, and a pre-emphasis network substantially complementary to the de-emphasis network to which the digitised signals are applied.

BRIEF DESCRIPTION OF THE DRAWINGS

Embodiments of the invention will now be described with reference to the accompanying drawings, wherein.

DESCRIPTION OF THE PREFERRED EMBODIMENTS

Figure 1:
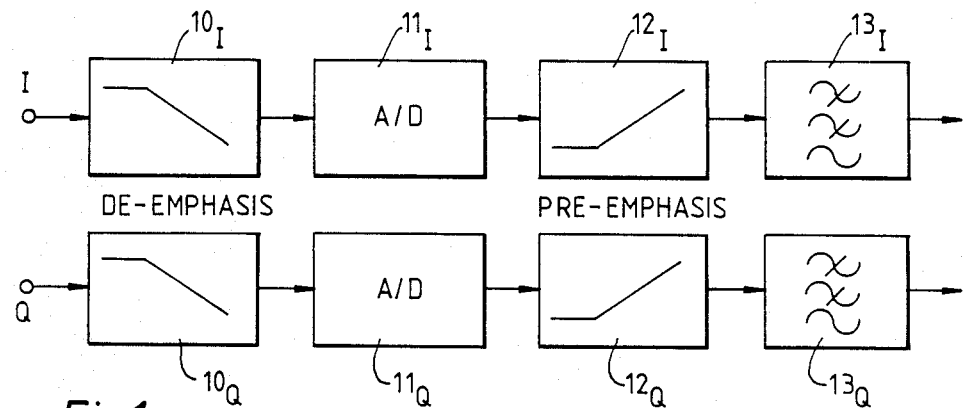
FIG. 1 illustrates the incorporation of analogue-to-digital converters with de-emphasis and pre-emphasis networks in the I & Q channels of a zero IF radio receiver.

In a zero IF radio receiver the incoming analogue modulation RF signals are mixed with a local oscillator signal at the carrier frequency to provide quadrature baseband signals—the so-called I and Q channels. As shown in FIG. 1 in each of the I and Q channels the analogue baseband signals are first applied to de-emphasis networks $10_I$ and $10_Q$ respectively. The de-emphasis networks attenuate the higher analogue frequencies relative to the lower frequencies. The de-emphasised analogue signals are applied to a conventional A/D converter $11_I$, $11_Q$ and the digitised signals are then fed to digital pre-emphasis networks $12_I$, $12_Q$. The frequency response of the pre-emphasis networks is such as to correct the distortion introduced by the de-emphasis networks. The critical point is that in a zero IF radio, for example, the unwanted strong signals are always on the high frequency side of the wanted signals in the I and Q channels. The unwanted signals will be filtered out by using a low pass filter $13_I$, $13_Q$ in each channel.

Figure 2:
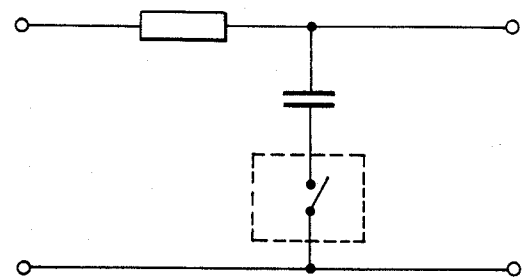
FIGS. 2-4 illustrate alternative forms of de-emphasis networks.
Figure 3:
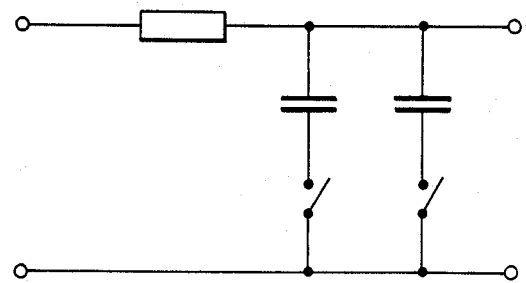
Figure 4:
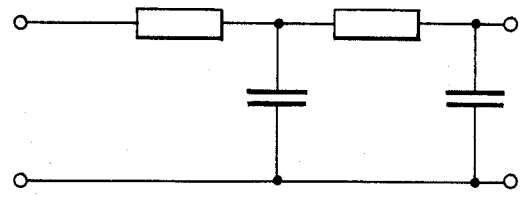

Thus this combination is effective in reducing the instantaneous dynamic range with which the A-to-D converter has to cope. In practical terms, this changes the analogue-to-digital converter difficulty from being extreme to well within the state of the art. The de-emphasis network may be as simple as one resistor R and one capacitor C in each channel as shown in FIG. 2, providing a simple 6 dB per octave slope with a breakpoint defined by the resistor and capacitor. An optional switch S may be included if it is anticipated that at some time the de-emphasis is required to be negated. Furthermore, the network could be switched with more than one capacitor or resistor, the switching being effected with electronic switches $S_1$, $S_2$ as shown in FIG. 3, such that the breakpoint can be moved for different bandwidths of signals. Yet again, the slope could be varied by having more than one section of such a network, as shown in FIG. 4. The choice of the breakpoint and the slope will depend on the particular characteristics of the wanted and unwanted channel spacings which have to be met for any particular specification. Typically, however, in a radio equipment, for example for single sideband signals, and also for narrow band frequency modulated signals, the breakpoint might be at about 500 Hz and a 6 dB per octave slope used. In this case, the ratio for channelised signals either 5 KHz channelled SSB or 25 kHz channelled frequency modulated signals is at least 2:1 between the top end of the wanted signal baseband when folded in half in the zero IF radio and the bottom end of a modulated signal on the adjacent channel. An unmodulated signal on the adjacent channel would have frequency ratio of 3:1 compared with wanted signal.

The pre-emphasis can be achieved by a digital filter of the conventional type. Alternatively the pre-emphasis characteristic required can be incorporated into the design of the digital low pass filter which follows the A-to-D converter.

In order to preserve the fidelity of the signals in the receiver system, it is important that the digital pre-emphasis accurately matches the analogue de-emphasis. The analogue de-emphasis can vary, particularly its corner frequency, due to drift of components in the analogue section with time, temperature and variations with manufacturing tolerances. These variations may be eliminated by a calibration system in which an analogue tone at a known level is digitally generated and input to the beginning of the A to D converter system, i.e. before the de-emphasis network. This tone is at a point, for example a decade down the 6 dB per octave slope, where its loss would be about 20 dB. The level of this tone is then measured in the digital system and the digital pre-emphasis network corner corrected appropriately depending upon the amplitude measured. This procedure would be inserted as part of the digital signal processing system and the calibration would be performed at an interval which would depend upon the application and use of the particular equipment.

In a further variation of this the analogue tone at the input to the whole A to D converter system, including any anti-aliasing filters or other pre-digitisation analogue components is varied across the whole of the baseband and the response is digitally equalised by a suitably constructed network in the digital domain. In both of the foregoing examples, the analogue tone may either be generated with a separate oscillator or synthesised by the digital part working through a digital to analogue converter to the output.

I claim:

1. A zero IF radio receiver of the type wherein a received analog signal is processed to produce quadrature component I and Q channels which are subsequently digitized, comprising, in each of said I and Q channels, a de-emphasis network to which the respective quadrature analog component of the received signals is applied, an analog-to-digital converter for digitizing the de-emphasized analog component to produce a digitized signal, and a pre-emphasis network to which the digitized signal is applied, the de-emphasis network in each channel comprising a dual break-point network having selectable frequency de-emphasis characteristics for attenuating higher frequency analog signals relative to lower frequency analog signals, and said pre-emphasis network in each channel being substantially complementary to the de-emphasis network in that channel.

2. A zero IF radio receiver according to claim 1 further comprising, in each of said I and Q channels, a low pass filter connected to an output of the pre-emphasis network in that channel.

3. A zero IF radio receiver according to claim 1, wherein said de-emphasis network comprises switched resistor-capacitor networks.

4. A zero IF radio receiver according to claim 1, wherein said pre-emphasis network comprises a digital filter.

* * * * *